(12) United States Patent  
Crawford et al.

(10) Patent No.: US 9,269,417 B2  
(45) Date of Patent: Feb. 23, 2016

(54) MEMORY REFRESH MANAGEMENT

(71) Applicant: Intel Corporation, Santa Clara, CA (US)

(72) Inventors: John H. Crawford, Saratoga, CA (US); Suneeta Sah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 13/761,385

(22) Filed: Feb. 7, 2013

(65) Prior Publication Data

US 2014/0192605 A1 Jul. 10, 2014

Related U.S. Application Data

(60) Provisional application No. 61/748,924, filed on Jan. 4, 2013.

(51) Int. Cl.  
*G11C 7/00* (2006.01)  
*G11C 11/406* (2006.01)  
*G11C 11/4076* (2006.01)

(52) U.S. Cl.  
CPC .... *G11C 11/40611* (2013.01); *G11C 11/40618* (2013.01); *G11C 11/406* (2013.01); *G11C 11/4076* (2013.01)

(58) Field of Classification Search  
CPC .......... G11C 11/406; G11C 11/40618; G11C 2211/4067; G11C 7/22; G11C 29/02; G11C 7/1051  
USPC ........... 365/222, 233.1, 189.12; 711/106, 154  
See application file for complete search history.

(56) References Cited

U.S. PATENT DOCUMENTS 6,327,210 B1 * 12/2001 Kuroda et al. ................ 365/222  
8,724,415 B2 * 5/2014 Kuroda ........................ 365/222

OTHER PUBLICATIONS

Liu, et al. "RAIDR: Retention-Aware Intelligent DRAM Refresh", paper, 12 pages, Carnegie Mellon University, Pittsburgh, PA.

* cited by examiner

*Primary Examiner* — David Lam  
(74) *Attorney, Agent, or Firm* — Thorpe North & Western, LLP

(57) ABSTRACT

Apparatus, systems, and methods to manage memory refresh operations are described. In one embodiment, an electronic device comprises a processor and memory controller logic to determine a memory refresh frequency for a memory system and transmit refresh commands to a refresh control logic in at least one memory bank coupled to the memory controller according to the memory refresh frequency. Other embodiments are also disclosed and claimed.

25 Claims, 7 Drawing Sheets

```
Define Ranks integer; / number of ranks on the channel
Define #DRAMs integer; / number of DRAM chips per rank
Define MPR.Extra5 integer; / field in MPR register (copy), identifying extra refresh needs,
5% increments
        / a zero in MPR.Extra5 would indicate the DRAM doesn't support this feature
Define ExtraRefresh[Ranks] integer; / number from 1 to 15 indicating, in 5% increments,
extra refresh needs
Define MPR.VolatileListSize integer; / number of entries in a volatile refresh row list, 0 if
not supported
Define VolatileListSize[Ranks] integer;
For i = 0 to Ranks {
        ExtraRefresh[i] = 0; / initialize to zero – will hold max across DRAMs in this rank
        VolatileListSize[i] = infinity; / initialize to largest possible size
        For j = 0 to #DRAMs {
                Read MPR from DRAM[j];
                ExtraRefresh[i] = Max(ExtraRefresh[i], MPR.Extra5);
                VolatileListSize[i] = Min(VolatileListSize[i], MPR.VolatileListSize);
                MERGE other MPR attributes across the DRAMs in a Rank…
                } /exit loop with ExtraRefresh[i] holding the MAX across the DRAMs in
Rank[i] of
                / the extra refresh needs, in increments of 5%
        } / exit loop with ExtraRefresh[] initialized to the refresh needs per rank
```

*FIG. 5*

```
Define RefreshCount[Ranks] integer; / count of refresh cycle run to each rank on the channel
                                    /could be init to 0, but it really doesn't matter
On Refresh[i] { / action taken when a refresh to rank i is required (tREFI timeout for that
rank)
        Drive a REF command to rank i;
        If RefreshCount[i]++ Mod 20 = 0 { / every 20 refresh cycles do extra refreshes
                For j=1 to ExtraRefresh[i] {
                        Drive a REF command to rank i;
                        }
                }
        }
```

*FIG. 6*

```
MainRefCtr=0 integer;
MainRows=32768;
MainArray [MainRows] row; / main cell array, 8Kb per row...
NextRow=0 integer; / next row in the ExtraRowArray list to refresh
ExtraRows=128;
ExtraRowArray[ExtraRows] STRUCTURE {/ Extra refresh row list: address and rate
        RowAddress Integer; / address of row needed extra refresh
        Rate Integer; / rate – 1, 2, 4 to indicate every, every other, every 4th extra refresh
        }
ExtraEpoch=0; / track epoch of extra refreshes – used to NOP rows that only need a
              /sub-multiple of extra refreshes, indicated in the ExtraRowArray[].Rate field
ExtraRefreshRate=8; /8x refresh rate in the Extra area
ExtraCycleSteal=MainRows/(ExtraRows*ExtraRefreshRate); /ratio of cycles to steal
RefreshState=Main set{Main, Extra}; /used to flip between main and Extra refresh On Refresh CMD { / when DRAM receives a REF command from the controller
        If RefreshState=Main { /do not steal a refresh – move ahead in main rows
                Refresh MainArray(MainRefCtr);
                MainRefCtr = ( MainRefCtr+1) mod MainRows;
                If MainRefCtr mod ExtraCycleSteal = 0 { /steal next cycle
                        RefreshState = Extra;
                        }
                }
        Elseif RefreshState=Extra { /steal a refresh for Extra area
                If ExtraEpoch MOD ExtraArray[NextRow].Rate = 0 {
                        Refresh MainArray[ExtraArray[NextRow].RowAddress];
                        / Extra row refresh – cycle stolen
                        }/ elide the extra refresh if rate is >1 for certain epochs
                If NextRow++ >= ExtraRows {
                        NextRow = 0; /wrap the extra list counter
                        ExtraEpoch = ( ExtraEpoch + 1) MOD ExtraRefreshRate;
                                / track the epoch to elide refresh of rows with lower rate needs
                        }
                RefreshState = Main; /back to main rows for next refresh
                }
        }
```

FIG. 7

MEMORY REFRESH MANAGEMENT

FIELD

The present disclosure generally relates to the field of electronics. More particularly, some embodiments of the invention generally relate to memory refresh management for dynamic random access memory (DRAM).

BACKGROUND

Dynamic Random Access Memory (DRAM) memory systems may require refresh operations to be implemented on a regular basis. Existing practice is to specify a fixed refresh period (e.g., 64 msec) and DRAM memory systems are built to conform to the fixed refresh period. Variation in the refresh needs of individual memory cells in a DRAM memory system necessitates that the weakest memory cell (i.e., the one requiring the most frequent refresh) determines the refresh requirement for the entire DRAM. Refresh requirements for cells in a DRAM memory system will form a distribution, and the distribution exhibits a fairly long tail of refresh requirements for quite frequent refreshes for a very small percentage of the cells. Since the refreshes are done on a per row basis (typically 8K bits per row), the weakest cell in a row will determine the refresh requirements of any given row, and therefore the row containing the weakest cell will determine the refresh period needed by all of the rows in the DRAM. Thus, many rows in a DRAM memory system are being refreshed more frequently than required, which wastes system resources.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIGS. 5, 6, and 7 are pseudocode illustrating operations in a method implement memory refresh management in accordance with various embodiments discussed herein.

DETAILED DESCRIPTION

Figure 1:
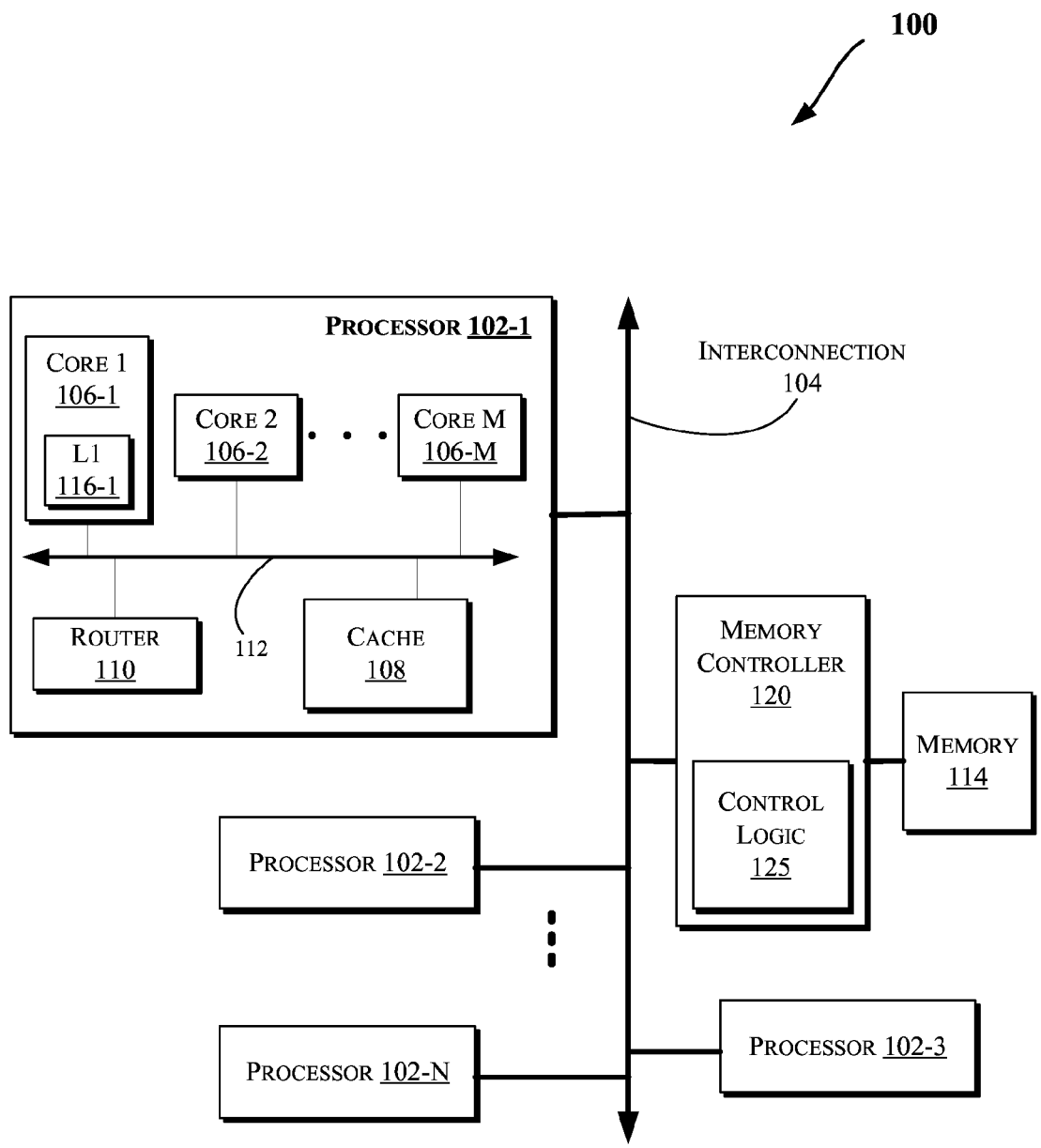
FIG. 1 is a schematic, block diagram illustration of an electronic device which may be adapted to implement memory refresh management in accordance with various embodiments discussed herein.

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some memory systems may be implemented one or more direct in-line memory modules (DIMMs), each of which may comprise one or more memory ranks which in turn may comprise one or more DRAM chips. Further, some electronic devices (e.g., smart phones, tablet computers, and the like) may comprise simpler memory systems comprised of one or more DRAMs.

Memory refresh complexity is expected to increase due to a number of physical constraints as semiconductor scaling progresses to smaller geometries. As a result the refresh period will shift to shorter refresh periods and the tail of cells which need rapid refresh will grow. Cells may experience variations in refresh needs, referred to as "erratic bits" over time.

Some cells which require more frequent refresh operations may be identified when a memory device is manufactured (time "T0") by the DRAM vendor. Some cells which require more frequent refresh operations may be discovered and change over time when the memory device is in use. A mix of system-level and internal DRAM detection/tracking may be beneficial. Methods to schedule extra refresh cycles may provide utility.

Described herein are systems, methods, and logic for memory refresh management in devices which include memory such as dynamic random access memory (DRAM). In various embodiments a memory controller may cooperate with memory refresh logic which may reside on a DRAM chip to manage refresh operations on the DRAM chip. The DRAM chip may comprise a memory table which may store a list of row address associated with information on the row address, required refresh rate, frequency or period, for the row. In some embodiments a manufacturer or distributor of the DRAM chip may pre-load the memory table with row addresses and associated refresh periods for rows that require extra refresh periods. The memory controller may query the memory table to retrieve the list of addresses and refresh periods, and may determine a memory refresh frequency using the information in the table. The memory controller may query a register or registers in the DRAM chip to determine a refresh frequency. The memory controller may then transmit refresh commands to a refresh control logic associated with the DRAM chip in accordance with the memory refresh frequency. The memory refresh logic receives a refresh command from the memory controller, selects a row from the memory table, and implements a refresh operation on the selected row.

In normal refresh operations DRAMs may maintain a row address refresh counter that identifies the next row to be refreshed and may refresh that row (or multiple rows) in each of the banks when a refresh command is received by the DRAMs in a Rank (and sequencing the bank refreshes within a DRAM if required), then increment the counter to point to the next sequential row(s) to be refreshed. When the counter reaches the last row in the bank it wraps back to 0 to start a new refresh cycle through the rows.

If a list of the weak rows is stored in each DRAM bank, then when the system provides a new refresh command that indicates a refresh from this list instead of the normal refresh of sequential rows, each DRAM bank can refresh the next weak row on its own list. This limits the number of extra refresh commands needed to the maximum across all of the DRAM banks in the memory system. The weak cells/rows identified by the manufacturer may be stored in fuses or other memory, in the DRAM itself, or in the serial presence detect (SPD) table on a DIMM and communicated to each DRAM at initialization with some new command. Alternatively, the weak cells/rows may be discovered at a cold system boot through a self-test and stored in the DRAM, or by another suitable method.

The techniques discussed herein may be provided in various computing systems (e.g., including servers, desktops, notebooks, smart phones, tablets, portable game consoles, etc.) which may include a memory system comprising multiple DRAM chips commonly assembled into a dual in-line memory module (DIMM). In such embodiments, each DRAM may comprise separate refresh control logic. Alternatively, refresh control logic may be implemented at the DIMM level to control operations for multiple DRAMs in a DIMM.

FIG. 1 is a schematic, block diagram illustration of an electronic device which may be adapted to implement memory refresh management in accordance with various embodiments discussed herein. Referring to FIG. 1, a system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor 102-1 may be implemented on a single integrated circuit (IC) chip containing one or more processor cores 106. Moreover, the chip may include one or more shared and/or private caches (such as cache 108), buses or interconnections (such as a bus or interconnection 112), memory controllers (such as those discussed with reference to FIGS. 8-9), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory/storage 114 for faster access by the components of the processor 102. As shown in FIG. 1, the memory/storage 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory/storage 114 may be coupled to other components of system 100 through a memory controller 120. Memory/storage 114 may include DRAM memory in some embodiments. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments. Also, in some embodiments, system 100 may include logic (e.g., DRAM controller logic 125) to issue read or write requests to the memory/storage 114 in an optimal fashion, e.g., to improve DRAM memory reliability, including program disturb, and/or charge loss over time, as will be further discussed herein.

Figure 2A:
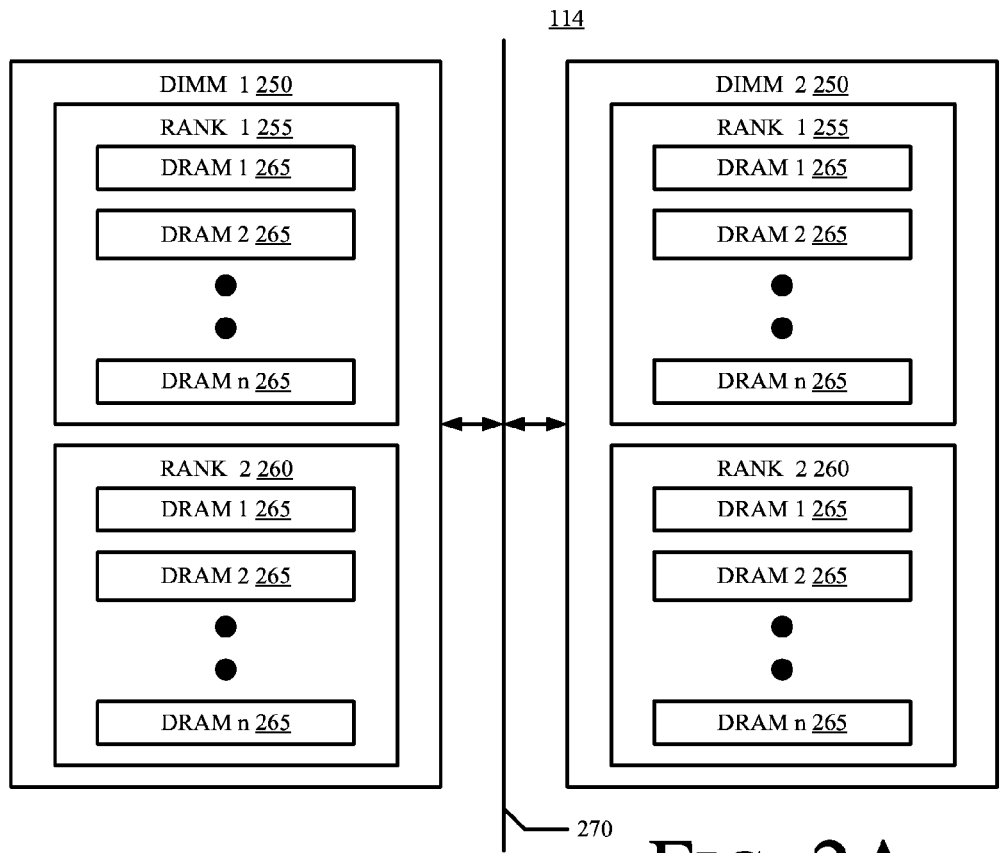
FIG. 2A is a schematic, block diagram of an exemplary memory which may be adapted to implement memory refresh management in accordance with various embodiments discussed herein.

In various embodiments, memory 114 may be implemented as a memory system using one or more DRAM memory modules. FIG. 2A is a schematic, block diagram of an exemplary memory 114 which may be adapted to implement memory refresh management in accordance with various embodiments discussed herein. Referring to FIG. 2A, in some embodiments the memory 114 may comprise one or more direct in-line memory modules (DIMMs) 250 coupled to a memory channel 270 which provides a communication link to memory controller 120. In the embodiment depicted in FIG. 2A each DIMM comprises a first rank 255 and a second rank 260, each of which includes a plurality of DRAM modules 265. One skilled in the art will recognize that memory system 114 may comprise more or fewer DIMMs 250, and more or fewer ranks per DIMM. Further, some electronic devices (e.g., smart phones, tablet computers, and the like) may comprise simpler memory systems comprised of one or more DRAMs.

Figure 2B:
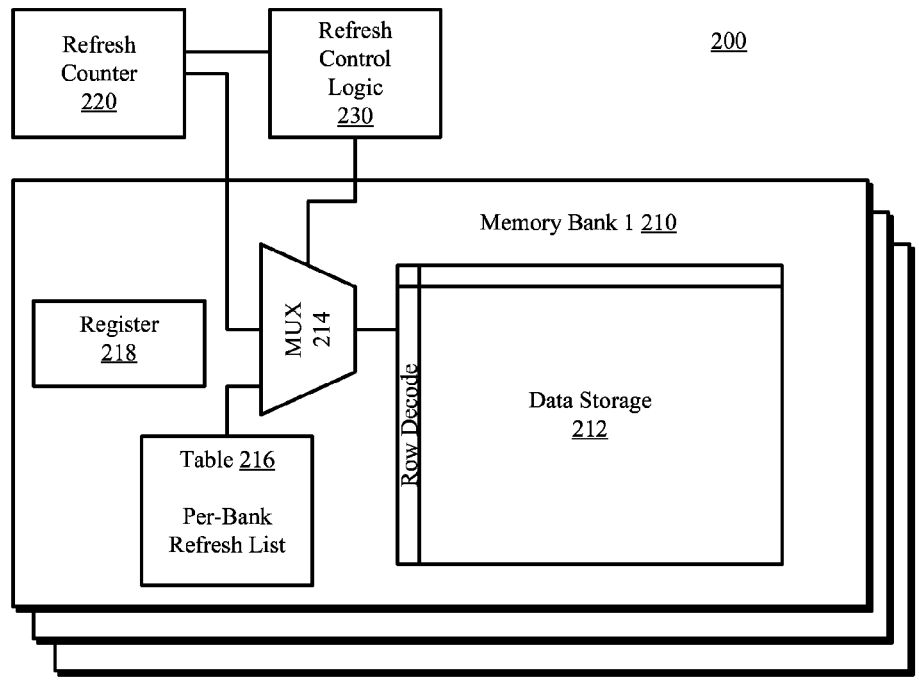
FIGS. 2B and 3 are a schematic, block diagram illustrations of components of an apparatus to implement memory refresh management in accordance with various embodiments discussed herein.

In some embodiments control logic 125 implements operations to manage refresh operations of the respective DRAM chips in memory 114. FIG. 2B is a schematic, block diagram illustration of components of a memory 200 which may comprise any of the DRAMs 265 depicted in FIG. 2A. Referring to FIG. 2B, in some embodiments the memory 200 may comprise one or more memory banks 210, which may be embodied as DRAM memory banks. Memory bank 210 may comprise data storage 212 comprising data cells which are structured into memory tables addressable by rows and/or columns.

A memory table 216 is coupled to the data storage 212 via a multiplexer 214 that selects a row address for refresh from either the "normal" sequential refresh counter 220, or an address from the next element of the Per-Bank Refresh List 216, selected by Next Row counter 330, as controlled by the refresh control logic 230. Memory table 216 may be stored in non-volatile memory and may comprise a per-bank refresh list which stores a list of row addresses in the memory 210 which may require more frequent refresh. The refresh rate for these rows may be provided to the system memory controller 120 for it to drive extra refresh cycles to the memory 114. This refresh rate may be communicated as a fixed rate per a specification or standard, or may be provided in a register on the memory DIMM, or in a register 218 within each DRAM chip either per-bank, or as a common rate for all banks in the DRAM. In addition, in order to optimize the provision of extra refresh for these rows, memory table 216 may include a rate associated with each row address. This information on the required refresh frequency (e.g., frequency, rate, or period) for the row, bank, DRAM, DIMM, or memory system as determined at manufacturing test or determined during system operation. Memory 200 may further comprise a refresh counter 220 and refresh control logic 230.

In some embodiments memory 200 be embodied as a DRAM chip and may comprise a plurality of memory banks 210, each of which may include a memory table 216 and multiplexer 214. In some embodiments each memory bank 210 may comprise a refresh counter 220 and refresh control logic 230, while other embodiments the refresh counter 220 and refresh control logic 230 may be implemented at the DRAM level and control the refresh of several or all banks within a DRAM.

As described above, in some embodiments the memory control logic 125 in the memory controller 120 cooperates with the refresh control logic 230 to manage refresh operations in memory 200. In embodiments described herein the refresh control logic 230 may manage both the regularly scheduled periodic refresh cycles (i.e., the normal refresh cycles) plus extra refresh cycles implemented to accommodate the refresh requirements of weak rows/cells.

Two different techniques may be used to implement extra refresh cycles. In a first technique the memory control logic 125 may periodically generate and send special refresh commands to the memory system which are used to refresh weak cells. In a second embodiment the memory control logic 125 transmits normal refresh commands to a memory rank for the "normal" refreshes, and also for the "extra" refreshes. The DRAM and memory controller 120 may identify an extra refresh rate (which may be read from the register 218). The memory control logic 125 then increases the rate of refresh cycles driven by the specified amount and the refresh control logic 230 "steals" a specified percentage of refresh cycles to be used for the "extra" cycles, with the remainder used for the "normal" cycles.

In some embodiments the memory control logic 125 drives the frequency of the extra cycles by driving a new refresh cycle to the memory 200 that indicate that the refresh cycle is an extra cycle intended to accommodate the rows/cells on the per-bank refresh list 216. Alternatively, the memory control logic 125 may increase the rate of refresh cycles it sends in order to accommodate the sum of the normal refreshes cycled through the rows plus the additional new cycles to be run for the addresses in the per-bank refresh list. In either case, the refresh control logic 230 may control MUX 214 to select the row to refresh either from the internal sequential row address counter 220 tracking the row to be refreshed, or will select the next per-bank refresh address from the list 216.

The memory controller 120 may interrogate the memory system to determine a number of extra refresh cycles required to accommodate the needs of the memory banks 210 (e.g., DRAMs) in a memory system. In some embodiments a memory may include a short (e.g., 4 bit) field in a register 218 to indicate with a granularity of 5% what extra refreshes are needed on a per-bank basis. The memory system may specify the extra refreshes needed on a per-bank, per rank, per-DIMM, or larger granularity. The memory controller 120 may access the registers in all of the memory DRAMs at boot to determine the pace of the extra refreshes needed. For example, it could take the maximum rate across all of the DRAMs in a rank to determine the pace needed on a per-rank basis. This would optimize the frequency on a per-rank basis to minimize the performance and power implications of the extra refreshes. Alternatively, the memory controller 120 could take the maximum rate across all the DRAMs in all of the ranks to arrive at a safe pace system wide, at the potential increase in power increase or performance loss if one rank needs a significantly higher pace than the others, for example.

Alternatively, if refreshes are driven on a per-bank basis, and the DRAMs provided a register 218 for each bank, the memory controller may access the register in each bank to determine the exact refresh needs to each bank individually.

Figure 3:
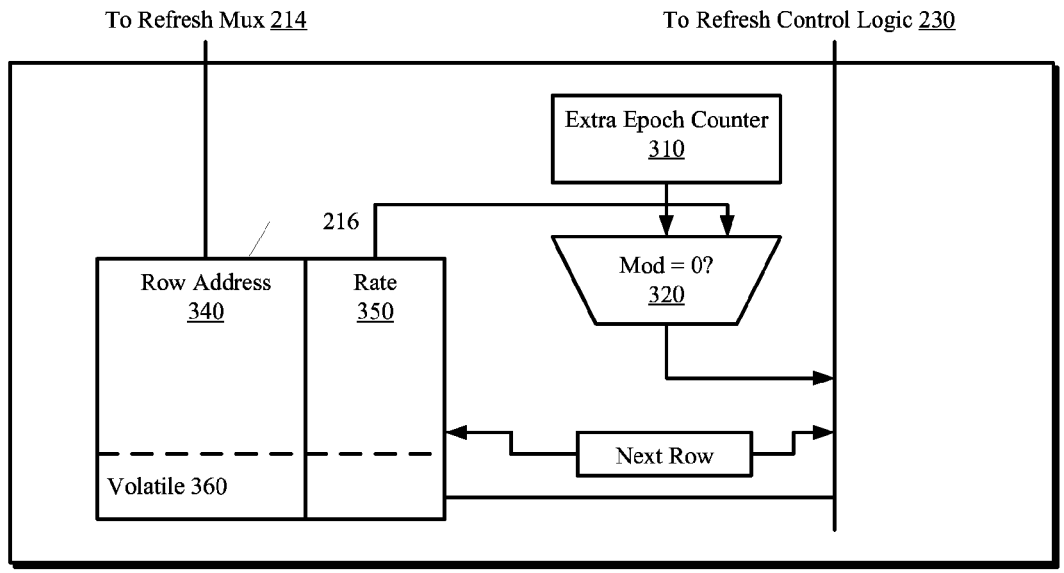
Figure 4:
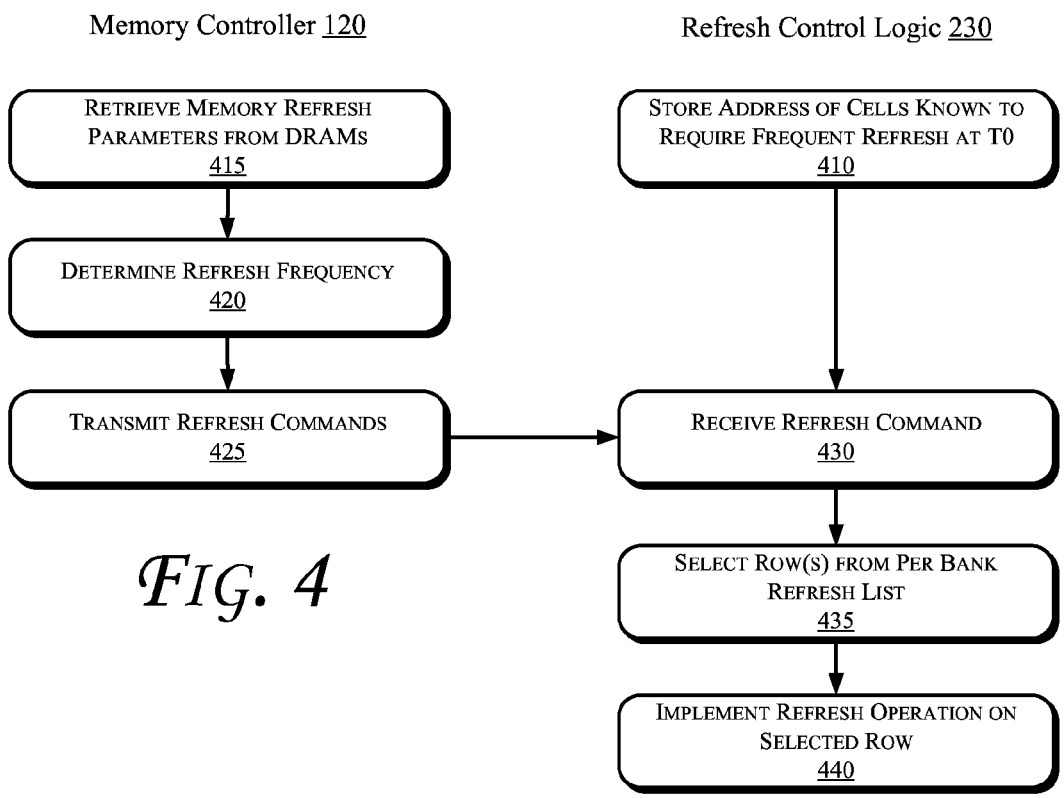
FIG. 4 is a flowchart illustrating operations in a method implement memory refresh management in accordance with various embodiments discussed herein.

Operations implemented by memory control logic 125 in the memory controller 120 and the refresh control logic 230 will be described with reference to FIGS. 3-6. Referring first to FIG. 4, at operation 410 the refresh control logic 230 may store in the memory table 216 the row addresses of cells in memory 200 which are known to require frequent refresh operations. By way of example, in some embodiments the manufacturer or distributor of the memory 200 may determine during production or testing which row(s) in a memory bank in a memory 200 require more frequent refresh operations. The row addresses may be stored in table 216. In order to optimize the extra refreshes, some embodiments may store a recommended refresh rate with each row address, as indicated in FIG. 3. Thus, rows which require additional refresh operations may be identified with the memory 200 when the memory is sold or distributed.

When the memory 200 is activated in an electronic device such as the electronic device depicted in FIG. 1 the memory control logic 125 in memory controller 120 may retrieve (operation 415) the memory refresh parameters from the memory table 216. Alternatively, the memory control logic 125 in memory controller 120 may retrieve (operation 415) the memory refresh parameters from one or more registers 218, which as noted above, there might be one of these per bank, or shared across multiple banks in a DRAM chip. Alternatively, the memory refresh parameters may be supplied in a register on a DIMM, or may be established in a specification or standard. In embodiments which comprise a plurality of memories 200 the memory control logic may retrieve the memory refresh parameters from the memory tables 216, and/or one or more registers 218 in the respective memories 200.

At operation 420 the memory control logic 125 in memory controller 120 determines a refresh frequency which may be applied to the memory 200. This may be accomplished in a variety of ways. As described above, existing practice is to assign a fixed refresh rate to memory 200. In some embodiments the memory control logic 200 may work within this paradigm and may maintain a fixed refresh rate (e.g., 64 ms), but may schedule additional refresh cycles to accommodate the refresh requirements of rows identified in the memory tables 216 and/or register(s) 218.

One technique to schedule additional refresh cycles is described with reference to FIG. 5. Referring briefly to FIG. 5, in some embodiments the memory control logic 125 may set an additional refresh increment which represents a granularity on which extra refreshes are to be scheduled on a per bank-basis. By way of example, the refresh increment may be expressed as a percentage of the fixed refresh cycle (e.g., 5%).

At operation 415 the memory control logic 125 reads the memory registers in the respective memories 200 coupled to the memory control logic and sets the extra refresh frequency parameter to the maximum refresh increment in the respective registers 218. Thus, the operations may be performed in a loop for each memory register in the respective memories 200. The loop will terminate with the maximum extra refresh frequency parameter determined.

In one embodiment the refresh commands may be scheduled at a frequency that cycles through the rows in each per-bank refresh list 216 at a period corresponding to the shortest refresh period, and run a refresh for each row in the list corresponding to this rate. For power savings, an alternative implementation may filter the cycles based on their refresh period needs, running a refresh only when the current refresh epoch corresponds to a multiple of the minimum refresh period needed by an element. For example, if the shortest refresh period results in refreshes at 32× the normal rate, then a row that needed only a 4× refresh would only need to be done on ⅛th of the refresh cycles. A counter such as the extra epoch counter 310 (see FIG. 3) may be incremented when the list is restarted from the beginning to support this function. For example a row with a 4× refresh requirement would get refreshed only if the counter had 000 in the low bits, or only when the increment of the counter at the start of the list cycle generated a carry out of bit 2 into bit 3, where bit 0 is the low order bit of the counter.

In another embodiment the refresh commands may cycle through the refresh list in the registers at the maximum period in the refresh list, but include rows that need more frequent refreshes at multiple, evenly spaced, locations in the list. The refreshes might be driven at 4× the rate of normal refreshes in this case for example, and a row that needed a 16× normal refresh would then be placed in 4 equally spaced places on the per-bank refresh list.

In order to implement the extra refresh cycles, the memory controller logic 125 (or the driver if a new refresh command is used for the per-bank refreshes), and the refresh control logic 230 (which does more work if the per-bank refresh cycles are "stolen" from the normal refresh cycles) need to cooperate to schedule the appropriate number of refresh cycles. By way of example, the memory controller logic 125 may identify the frequency of extra refreshes needed, as noted above, by obtaining this parameter from the memory system. In the example above, the frequency was specified at a granularity of 5% extra (½₀th), up to 75%. The memory controller logic 125 may either shorten the refresh period by the indicated amount, or it could keep refresh period constant but drive extra refresh cycles at intervals determined by the frequency required. For example, if 50% more refresh cycles are needed, either the refresh period could be reduced by 33%, and every 3rd refresh be driven as an extra refresh cycle; or the refresh period could be held constant, and the memory control logic may drive two refresh cycles for every other refresh period in order to get the 50% extra refresh cycles driven. Alternatively, the memory controller logic 125 may drive twenty normal refresh cycles, and then drive N extra refreshes (after the 20th normal refresh) to accommodate the extra refreshes required.

Referring back to FIG. 4, at operation 425 the memory control logic 125 transmits refresh commands to the refresh control logic 230 in the respective memories 200 coupled to the memory controller 120. One technique to schedule additional refresh cycles is described with reference to FIG. 6. Referring briefly to FIG. 6, in some embodiments the memory control logic 125 may set a refresh counter, which may be incremented with each refresh command. As indicated in the pseudocode in FIG. 6, each time that the refresh counter reaches a value that is 0 mod 20, the memory control logic 125 will drive N extra refresh cycles, where N is the value determined in step 415, typically at system initialization, as discussed earlier.

If the system uses a special (i.e., different from the normal refresh command) command for the memory controller logic 125 to drive to the memory 114 to initiate an extra refresh command from the per-bank refresh list, then at operation 430 the refresh control logic 230 in the respective memory banks 210 receives the special extra refresh command. At operation 435 the refresh control logic 230 selects one or more rows from the memory table 216 to refresh, and at operation 440 the refresh control logic 230 implements refresh operations on the selected row. It is expected that the refresh control logic will select the next row from the per-bank list 216, as indicated by a Next Row counter 330 for the bank, drive the row address 340 read from the list by controlling multiplexer (MUX 214) to select the address from list 216, and then increment Next Row counter 330 to point to the next list element (wrapping back to the first element in the list after the last row in the list was handled).

Inside the memory 200, if there is no special cycle to indicate a per-bank refresh, the memory will need to "steal" a percentage of refresh cycles for per-bank refreshes. In the method above, where a percentage of cycles is given as a multiple of 5%, ranging from 1 to 15 (assuming a 4-bit field), then the memory can alternate between doing 20 normal refreshes, and then the specified count of per-bank refreshes, and then back to 20 normal refreshes. If the extra refresh count was specified as 35%, for example (7 times 5%), then the memory may do twenty normal refreshes, then seven per-bank refreshes, then 20 normal refreshes, then 7 per-bank, and so on. Or the extra refreshes may be more evenly disbursed as determined by the refresh control logic 230 in the DRAM.

The pseudo-code depicted in FIG. 7 describes a set of actions needed in the DRAM to steal refresh cycles for the extra refresh list, including logic to elide the refresh of lines that don't need refreshed on every extra refresh cadence (assuming an embodiment where the list includes a designation that the row needs refreshed only every ½, ¼, etc. of the accelerated extra refresh pace). The example presented in FIG. 7 assumes there are 128 rows in the Extra Refresh list in memory 216, and the accelerated refresh pace is 8× the normal refresh rate. This results in a need for 1K extra refresh cycles, in addition to the 32K driven at the normal pace. To achieve this, the memory banks 210 would need ½₂, or about 3% extra refresh cycles. In the 5% increment system used in the previous examples, this would be rounded up to a 5% extra refresh rate. That this example uses a different dispersion of the extra cycles than outlined above, by interspersing extra refresh cycles more evenly than the N every 20 method exemplified above.

Figure 8:
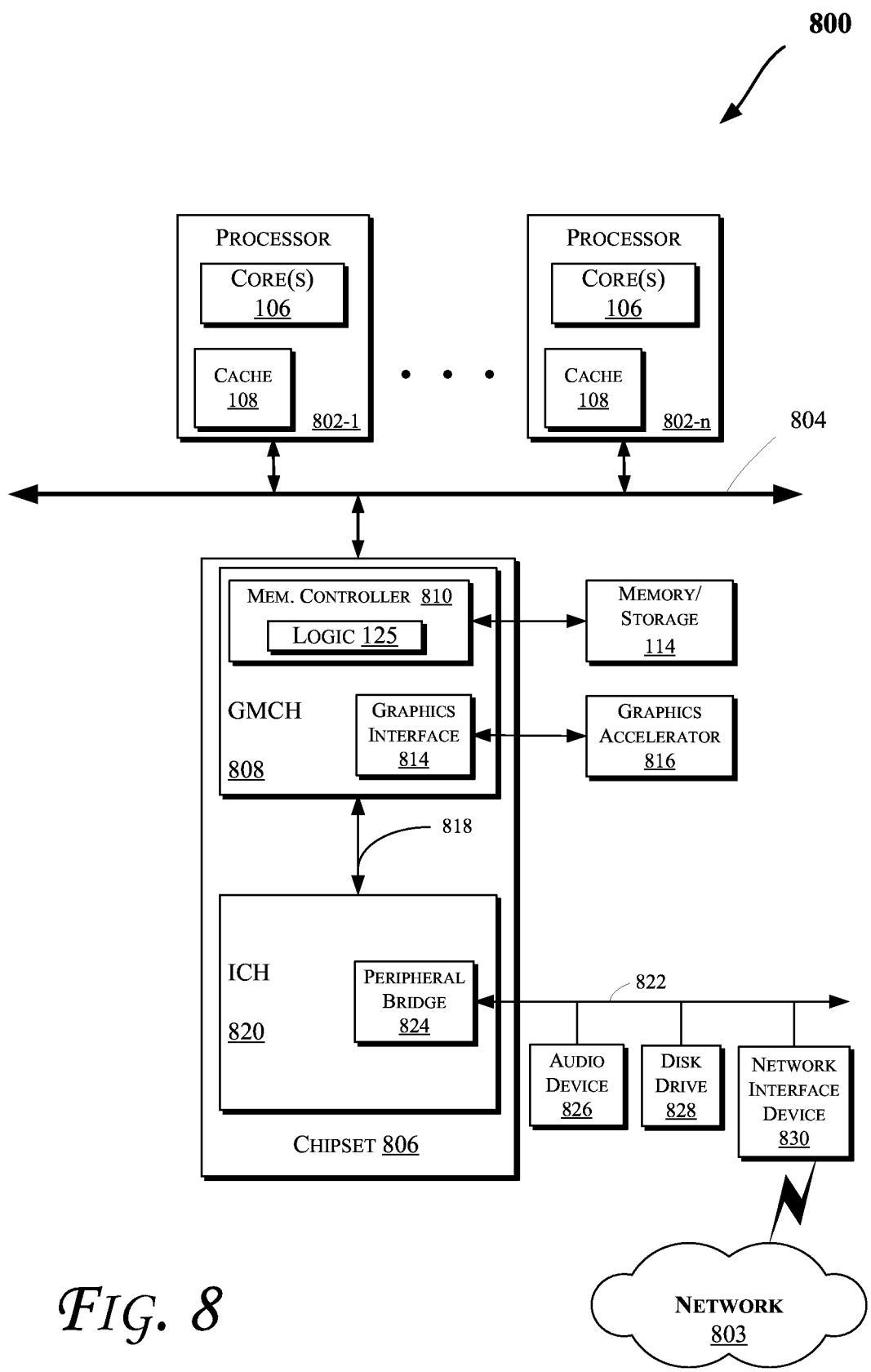
FIG. 8 is a schematic, block diagram illustration of an electronic device which may be adapted to implement Memory refresh management in accordance with various embodiments discussed herein.

FIG. 8 illustrates a block diagram of a computing system 800 in accordance with an embodiment of the invention. The computing system 800 may include one or more central processing unit(s) (CPUs) 802 or processors that communicate via an interconnection network (or bus) 804. The processors 802 may include a general purpose processor, a network processor (that processes data communicated over a computer network 803), an application processor (such as those used in cell phones, smart phones, etc.), or other types of a processor (including a reduced instruction set computer (RISC) processor or a complex instruction set computer (CISC)). Various types of computer networks 803 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G, Low Power Embedded (LPE), etc.). Moreover, the processors 802 may have a single or multiple core design. The processors 802 with a multiple core design may integrate different types of processor cores on the same integrated circuit (IC) die. Also, the processors 802 with a multiple core design may be implemented as symmetrical or asymmetrical multiprocessors.

In an embodiment, one or more of the processors 802 may be the same or similar to the processors 102 of FIG. 1. For example, one or more of the processors 802 may include one or more of the cores 106 and/or cache 108. Also, the operations discussed with reference to FIGS. 1-7 may be performed by one or more components of the system 800.

A chipset 806 may also communicate with the interconnection network 804. The chipset 806 may include a graphics and memory control hub (GMCH) 808. The GMCH 808 may include a memory controller 810 (which may be the same or similar to the memory controller 120 of FIG. 1 in an embodiment, e.g., including the logic 125) that communicates with the memory 114. The memory 114 may store data, including sequences of instructions that are executed by the CPU 802, or any other device included in the computing system 800. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Additional devices may communicate via the interconnection network 804, such as multiple CPUs and/or multiple system memories.

The GMCH 808 may also include a graphics interface 814 that communicates with a graphics accelerator 816. In one embodiment of the invention, the graphics interface 814 may communicate with the graphics accelerator 816 via an accelerated graphics port (AGP). In an embodiment of the invention, a display (such as a flat panel display) may communicate with the graphics interface 814 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display.

A hub interface 818 may allow the GMCH 808 and an input/output control hub (ICH) 820 to communicate. The ICH 820 may provide an interface to I/O devices that communicate with the computing system 800. The ICH 820 may communicate with a bus 822 through a peripheral bridge (or controller) 824, such as a peripheral component interconnect (PCI) bridge, a universal serial bus (USB) controller, or other types of peripheral bridges or controllers. The bridge 824 may provide a data path between the CPU 802 and peripheral devices. Other types of topologies may be utilized. Also, multiple buses may communicate with the ICH 820, e.g., through multiple bridges or controllers. Moreover, other peripherals in communication with the ICH 820 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 822 may communicate with an audio device 826, one or more drive(s) 828, which may be embodied as a disk drive or a solid state drive, and a network interface device 830 (which is in communication with the computer network 803). Other devices may communicate via the bus 822. Also, various components (such as the network interface device 830) may communicate with the GMCH 808 in some embodiments of the invention. In addition, the processor 802 and the GMCH 808 may be combined to form a single chip. Furthermore, the graphics accelerator 816 may be included within the GMCH 808 in other embodiments of the invention.

Furthermore, the computing system 800 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (which may be a magnetic hard disk drive or a NAND flash memory based solid state drive) (e.g., 828), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 9:
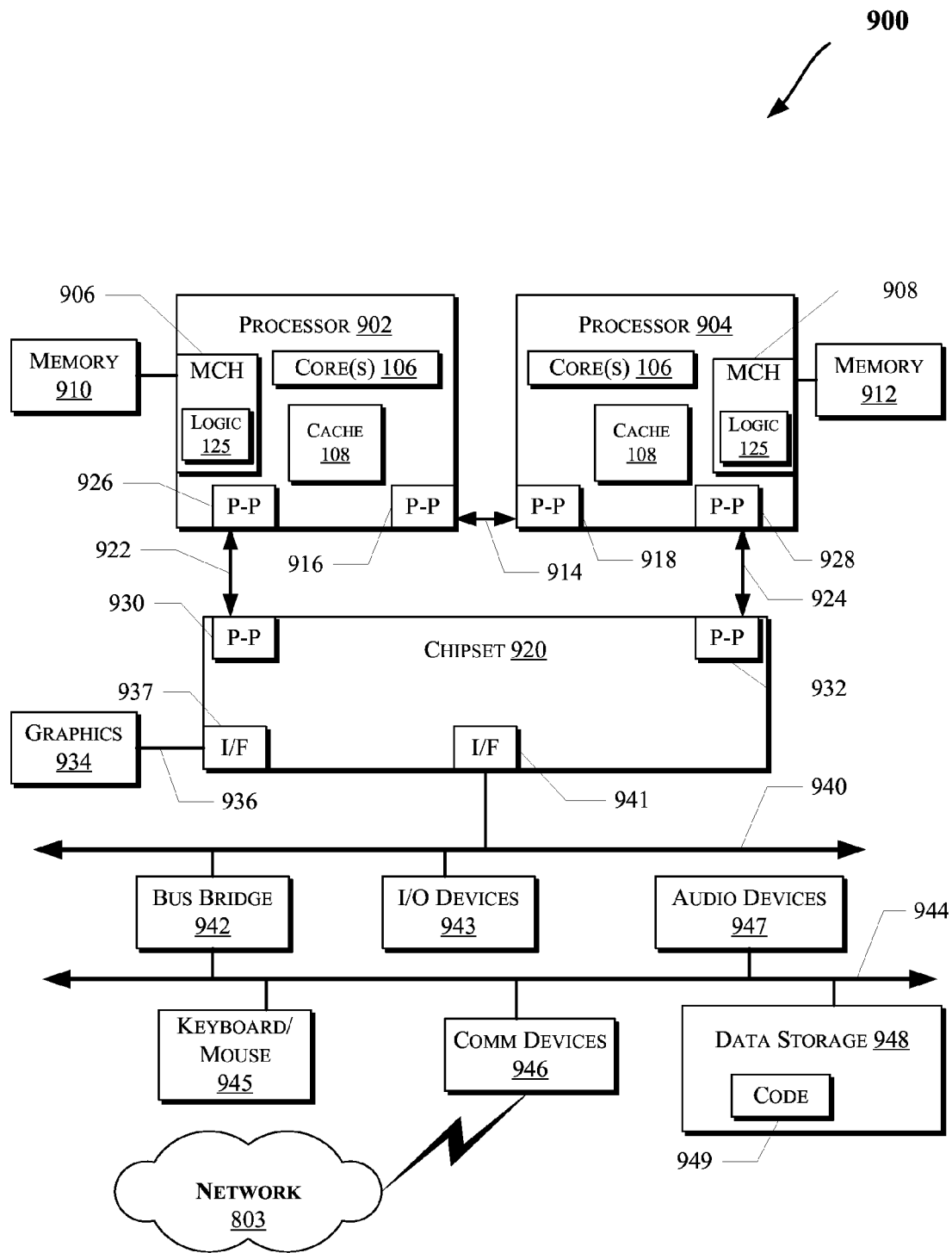
FIG. 9 is a schematic, block diagram illustration of an electronic device which may be adapted to implement Memory refresh management in accordance with various embodiments discussed herein.

FIG. 9 illustrates a computing system 900 that is arranged in a point-to-point (PtP) configuration, according to an embodiment of the invention. In particular, FIG. 9 shows a system where processors, memory, and input/output devices are interconnected by a number of point-to-point interfaces. The operations discussed with reference to FIGS. 1-8 may be performed by one or more components of the system 900.

As illustrated in FIG. 9, the system 900 may include several processors, of which only two, processors 902 and 904 are shown for clarity. The processors 902 and 904 may each include a local memory controller hub (MCH) 906 and 908 to enable communication with memories 910 and 912. The memories 910 and/or 912 may store various data such as those discussed with reference to the memory 114 of FIGS. 1 and/or 8. Also, MCH 906 and 908 may include the memory controller 120 and/or logic 125 of FIG. 1 in some embodiments.

In an embodiment, the processors 902 and 904 may be one of the processors 802 discussed with reference to FIG. 8. The processors 902 and 904 may exchange data via a point-to-point (PtP) interface 914 using PtP interface circuits 916 and 918, respectively. Also, the processors 902 and 904 may each exchange data with a chipset 920 via individual PtP interfaces 922 and 924 using point-to-point interface circuits 926, 928, 930, and 932. The chipset 920 may further exchange data with a high-performance graphics circuit 934 via a high-performance graphics interface 936, e.g., using a PtP interface circuit 937.

As shown in FIG. 9, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

In various embodiments of the invention, the operations discussed herein, e.g., with reference to FIGS. 1-9, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An electronic device comprising:
   a processor; and
   a memory control logic to:
      determine a memory refresh frequency for a memory system;
      transmit refresh commands to a refresh control logic in at least one memory bank coupled to the memory control logic according to the memory refresh frequency;
      retrieve a memory refresh parameter from a register in the at least one memory bank; and
      use the memory refresh parameter to determine the memory refresh frequency
      retrieve a plurality of memory refresh parameters from a plurality of memory banks coupled to the memory controller;
      determine a maximum memory refresh parameter; and
      set the memory refresh frequency to the maximum refresh parameter.

2. The electronic device of claim 1, wherein the memory controller comprises logic to generate refresh commands at a first refresh frequency which is constant.

3. The electronic device of claim 1, wherein the memory controller comprises logic to generate additional refresh commands at a second refresh frequency which is different than the first refresh frequency.

4. The electronic device of claim 1, wherein the memory controller comprises logic to generate refresh commands at a refresh frequency which varies over time in response to changes in the memory system.

5. The electronic device of claim 1 wherein refresh control logic in the memory bank comprises logic to:
   determine a refresh requirement for one or more rows in the memory bank; and
   store the refresh requirement in a memory register in association with a row address.

6. The electronic device of claim 5 wherein refresh control logic in the memory bank comprises logic to:
   receive a refresh command from the memory controller;
   select a row from the memory register; and
   implement a refresh operation on the row.

7. The electronic device of claim 5, wherein refresh control logic in the memory bank comprises logic to reorder refresh operations in the memory bank according to refresh requirements of rows of memory in the memory bank.

8. The electronic device of claim 1, wherein the memory controller further comprises logic to:
   identify one or more rows in the at least one memory bank which require more frequent refresh operations; and
   update a refresh frequency parameter for this one or more rows.

9. A memory controller comprising logic to:
   determine a memory refresh frequency for a memory system; and
   transmit refresh commands to a refresh control logic in at least one memory bank coupled to the memory controller according to the memory refresh frequency;
   retrieve a memory refresh parameter from a register in the at least one memory bank; and
   use the memory refresh parameter to determine the memory refresh frequency
   retrieve a plurality of memory refresh parameters from a plurality of memory banks coupled to the memory controller;
   determine a maximum memory refresh parameter; and
   set the memory refresh frequency to the maximum refresh parameter.

10. The memory controller of claim 9, wherein the memory controller comprises logic to generate refresh commands at a first refresh frequency which is constant.

11. The memory controller of claim 9, wherein the memory controller comprises logic to generate additional refresh commands at a second refresh frequency which is different than the first refresh frequency.

12. The memory controller of claim 9, wherein the memory controller comprises logic to generate refresh commands at a refresh frequency which varies over time in response to changes in the memory system.

13. The memory controller of claim 9, wherein the memory controller further comprises logic to:
   identify one or more rows in the at least one memory bank which require more frequent refresh operations; and
   update a refresh frequency parameter for this one or more rows.

14. A method comprising:
   determining, in a memory controller, a memory refresh frequency for a memory system; and
   transmitting refresh commands to a refresh control logic in at least one memory bank coupled to the memory controller according to the memory refresh frequency;
   retrieving a memory refresh parameter from a register in the at least one memory bank; and
   using the memory refresh parameter to determine the memory refresh frequency
   retrieving a plurality of memory refresh parameters from a plurality of memory banks coupled to the memory controller;
   determining a maximum memory refresh parameter; and
   setting the memory refresh frequency to the maximum refresh parameter.

15. The method of claim 14, further comprising generating refresh commands at a first refresh frequency which is constant.

16. The method of claim 14, further comprising generating additional refresh commands at a second refresh frequency which is different than the first refresh frequency.

17. An electronic device comprising:
a processor; and
a memory control logic to:
- determine a memory refresh frequency for a memory system; and
- transmit refresh commands to a refresh control logic in at least one memory bank coupled to the memory controller according to the memory refresh frequency, wherein refresh control logic in the memory bank comprises logic to:
  - determine a refresh requirement for one or more rows in the memory bank; and
  - store the refresh requirement in a memory register in association with a row address.

18. The electronic device of claim 17, further comprising logic to:
- retrieve a memory refresh parameter from a register in the at least one memory bank; and
- use the memory refresh parameter to determine the memory refresh frequency.

19. The electronic device of claim 18, further comprising logic to:
- retrieve a plurality of memory refresh parameters from a plurality of memory banks coupled to the memory controller;
- determine a maximum memory refresh parameter; and
- set the memory refresh frequency to the maximum refresh parameter.

20. The electronic device of claim 19, wherein the memory controller comprises logic to generate refresh commands at a first refresh frequency which is constant.

21. The electronic device of claim 19, wherein the memory controller comprises logic to generate additional refresh commands at a second refresh frequency which is different than the first refresh frequency.

22. The electronic device of claim 19, wherein the memory controller comprises logic to generate refresh commands at a refresh frequency which varies over time in response to changes in the memory system.

23. The electronic device of claim 17, wherein refresh control logic in the memory bank comprises logic to:
- receive a refresh command from the memory controller;
- select a row from the memory register; and
- implement a refresh operation on the row.

24. The electronic device of claim 17, wherein refresh control logic in the memory bank comprises logic to reorder refresh operations in the memory bank according to refresh requirements of rows of memory in the memory bank.

25. The electronic device of claim 17, wherein the memory controller further comprises logic to:
- identify one or more rows in the at least one memory bank which require more frequent refresh operations; and
- update a refresh frequency parameter for this one or more rows.

* * * * *